(12) United States Patent
Hou et al.

(10) Patent No.: US 11,808,492 B2
(45) Date of Patent: Nov. 7, 2023

(54) SYSTEMS AND METHODS FOR COOLING USING A COMPOSITE ELASTOCALORIC DEVICE

(71) Applicants: UNIVERSITY OF MARYLAND, COLLEGE PARK, College Park, MD (US); The Government of the United States of America, as represented by the Secretary of the Navy, Arlington, VA (US)

(72) Inventors: Huilong Hou, Greenbelt, MD (US); Ichiro Takeuchi, Laurel, MD (US); Margo Staruch, Alexandria, VA (US); Peter Finkel, Baltimore, MD (US)

(73) Assignees: University of Maryland, College Park, College Park, MD (US); The Government of the United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 16/582,458

(22) Filed: Sep. 25, 2019

(65) Prior Publication Data
US 2020/0096240 A1 Mar. 26, 2020

Related U.S. Application Data

(60) Provisional application No. 62/736,096, filed on Sep. 25, 2018.

(51) Int. Cl.
*F25B 21/00* (2006.01)
*H10N 30/20* (2023.01)
*H10N 35/00* (2023.01)
*H10N 30/853* (2023.01)
*H10N 35/85* (2023.01)

(52) U.S. Cl.
CPC .......... *F25B 21/00* (2013.01); *H10N 30/206* (2023.02); *H10N 35/00* (2023.02); *H10N 30/8548* (2023.02); *H10N 35/85* (2023.02)

(58) Field of Classification Search
CPC ...... F25B 21/00; F25B 23/00; H01L 41/0986; H01L 41/12; H01L 41/1875; H01L 41/20
See application file for complete search history.

(56) References Cited

U.S. PATENT DOCUMENTS

2005/0205125 A1* 9/2005 Nersessian ............... H02N 2/18
136/205

* cited by examiner

*Primary Examiner* — Ana M Vazquez
(74) *Attorney, Agent, or Firm* — RowanTree Law Group, PLLC; Frederick F. Rosenberger (57) ABSTRACT

A cooling system employs at least one composite elastocaloric device. Each composite device has a first member with a first material and a second member with an elastocaloric material. The first material increases in size in response to an applied electric or magnetic field and returns to its prior size upon removal of the applied electric or magnetic field. The first and second members are mechanically coupled together such that the increase in size of the first material applies a stress to the elastocaloric material and the return of the first material to its prior size releases said stress, thereby causing the elastocaloric material to absorb heat.

36 Claims, 7 Drawing Sheets

SYSTEMS AND METHODS FOR COOLING USING A COMPOSITE ELASTOCALORIC DEVICE

CROSS-REFERENCE TO RELATED APPLICATIONS AND PAPERS

The present application claims the benefit of U.S. Provisional Application No. 62/736,096, filed Sep. 25, 2018, which is hereby incorporated by reference herein in its entirety. The following publication is also incorporated by reference herein in its entirety: HOU et al., "Ultra-low-field magneto-elastocaloric cooling in a multiferroic composite device," *Nature Communications*, October 2018, 9:4075.

FIELD

The present disclosure relates generally to cooling, and more particularly, to cooling using a composite elastocaloric device.

SUMMARY

Embodiments of the disclosed subject matter employ a composite elastocaloric device to provide periodic or continuous localized cooling. In particular, strain induced in a first member is used to stress a second member, which is mechanically coupled to the first member and includes an elastocaloric material. The first member includes a magnetostrictive material, which increases in size in response to an applied magnetic field, or a piezoelectric material, which increases in size in response to an applied electric field. When the stress, which was applied to the second member via the strain induced in the first member, is released, the elastocaloric material can absorb heat from the surrounding environment or from a target thermally coupled thereto, thereby providing temporary localized cooling. In some embodiments, multiple composite elastocaloric devices can be operated in sequence to provide a substantially continuous cooling effect.

In one or more embodiments, a method for cooling comprises a loading phase of applying an electric or magnetic field to a first member, such that a first material of the first member increases in size in response to the applied field and stresses an elastocaloric material of a second member mechanically coupled to the first member. The method also comprises a cooling phase after the loading phase. The cooling phase involves removing the electric or magnetic field from the first member, such that the first material returns to its size prior to applying the electric or magnetic field, thereby releasing stress on the elastocaloric material from the first material. The release of stress on the elastocaloric material in the cooling phase causes the elastocaloric material to absorb heat.

In one or more embodiments, a system comprises at least one composite cooling device. Each composite cooling device comprises a first member and a second member. The first member has a first material, and the second member has an elastocaloric material. The first material is configured to increase in size in response to an applied electric or magnetic field and to return to its prior size upon removal of the applied electric or magnetic field. The first and second members are mechanically coupled together such that the increase in size of the first material applies a stress to the elastocaloric material in a loading phase. In a cooling phase after the loading phase, the field is removed such that the first material returns to its prior size, thereby releasing stress on the elastocaloric material and thus causing the elastocaloric material to absorb heat.

Objects and advantages of embodiments of the disclosed subject matter will become apparent from the following description when considered in conjunction with the accompanying drawings.

BRIEF DESCRIPTION OF DRAWINGS

Embodiments will hereinafter be described with reference to the accompanying drawings, which have not necessarily been drawn to scale. Where applicable, some elements may be simplified or otherwise not illustrated in order to assist in the illustration and description of underlying features. Throughout the figures, like reference numerals denote like elements.

DETAILED DESCRIPTION

Embodiments of the disclosed subject matter relate to cooling using a composite device. In a first phase of operation of the device (i.e., a loading or charging phase), strain induced in a first material of the composite device due to application of an electric or magnetic field is used to stress an elastocaloric material of the composite device. This first material is either a piezoelectric material, which changes size in response to an applied electric field, or a magnetostrictive material, which is a ferromagnetic material that changes size in response to an applied magnetic field. The elastocaloric material is a shape memory alloy (SMA) that undergoes reversible martensitic phase transformation in response to the applied stress from the first material.

In a second phase of operation (i.e., an unloading or cooling phase), the applied field is removed to allow the first material to return to its original shape and relax the stress on the elastocaloric material. The return of the elastocaloric material to its original state upon stress relaxation causes the elastocaloric material to absorb heat, thereby providing a temporary cooling effect to the surrounding environment or to a target in thermal communication with the elastocaloric material. The first and second phases of operation can be repeated to provide subsequent cooling effects. In some embodiments, multiple composite devices can be alternately operated, for example, having one composite device operate in its first phase while another composite device operates in its second phase, in order to provide a substantially continuous cooling effect.

Figure 1:
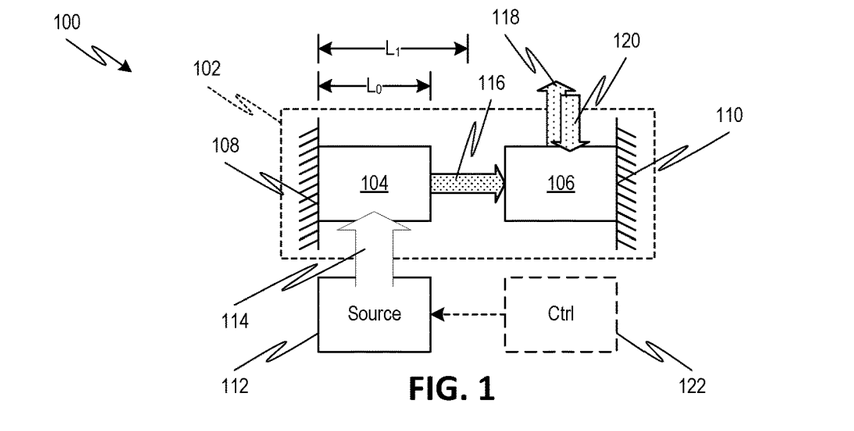
FIG. 1 is a simplified schematic diagram illustrating aspects of an exemplary system that uses a composite elastocaloric device to provide cooling, according to one or more embodiments of the disclosed subject matter.

Referring to FIG. 1, an exemplary cooling system 100 is illustrated. The cooling system 100 can include a composite elastocaloric device 102 and a source 112 that provides an appropriate electric or magnetic field 114. The system 100 can also optionally include a controller 122 that controls operation of the source 112. For example, the controller 122 can control the system 100 to effect the operational method of FIG. 2. In some embodiments, the system 100 can optionally include an actuator (not shown) that dictates an operational phase of the composite device 102 (e.g., loading phase, cooling phase, or an intermediate phase) by positioning the composite device 102 with respect to the field 114 from source 112.

The composite device 102 includes a first member 104 mechanically coupled (either directly via contacting surfaces or indirectly via one or more intervening members) to a second member 106. Each of the first member 104 and the second member 106 can be constructed as a block, bar, cylinder, pipe, layer, or any other three-dimensional geometric shape. The composite device 102 can also include a first fixture 108 that restrains movement of the first member 104 and a second fixture 110 that restrains movement of the second member 106. For example, the fixtures 108, 110 may be a fixed wall or a surface of a rigid structure. Although shown separately in FIG. 1, in some embodiments, the fixtures 108, 110 may be part of a unitary structure, for example, as surfaces of a common support frame surrounding the first member 104 and the second member 106. In some embodiments, installation of the first member 104 and/or the second member 106 between respective fixtures 108, 110 can result in an initial strain (i.e., strain prior to application of any field 114) for the first member 104 and/or an initial stress (i.e., stress prior to application of any field 114) for the second member 106.

The first member 104 includes at least a first material, which is either a piezoelectric material or magnetostrictive material. Thus, when an appropriate field 114 is applied to the first member 104 from the source 112, the first member 104 changes size, for example, by increasing from an original length $L_0$ (i.e., without any field 114 applied) to an extended length $L_1$. The strain induced in the first member 104 due to the field 114 application results in a stress 116 applied to the second member 106. The second member 106 includes at least an elastocaloric material, which undergoes a phase transformation in response to the stress 116. For example, the elastocaloric material of the second member 106 can be a copper-based SMA, such as, copper aluminum manganese (Cu—Al—Mn), copper aluminum nickel (Cu—Al—Ni), or copper zinc aluminum (Cu—Zn—Al).

Figure 14A:
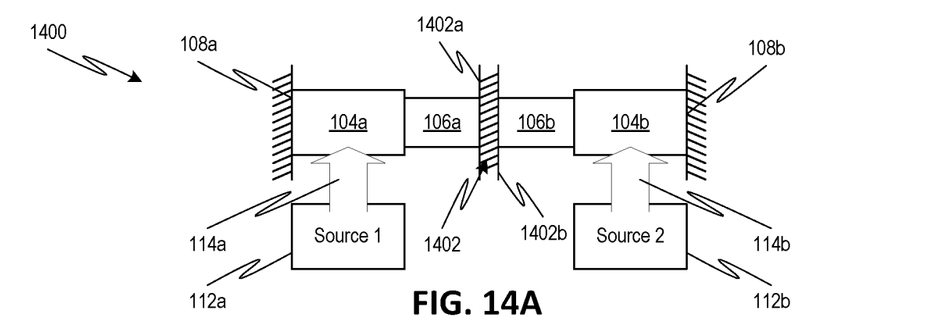
FIG. 14A is a simplified schematic diagram of a first exemplary cooling system configuration, according to one or more embodiments of the disclosed subject matter.
Figure 14B:
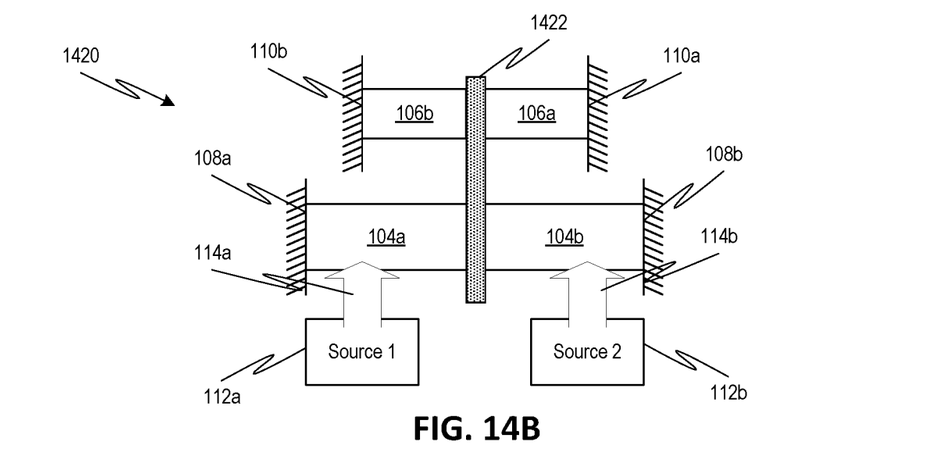
FIG. 14B is a simplified schematic diagram of a second exemplary cooling system configuration, according to one or more embodiments of the disclosed subject matter.
Figure 14C:
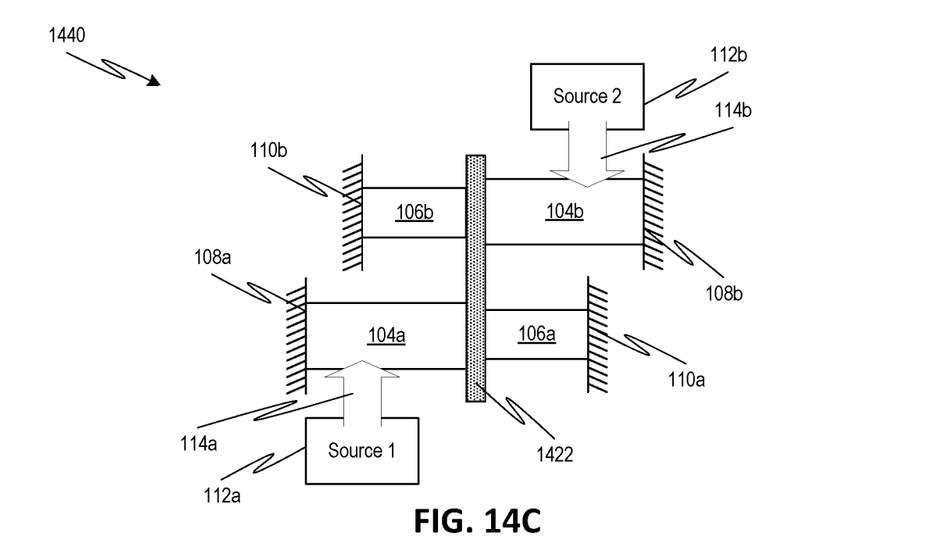
FIG. 14C is a simplified schematic diagram of a third exemplary cooling system configuration, according to one or more embodiments of the disclosed subject matter.

The first member 104 can have a force-applying surface in direct contact with a facing surface of the second member 106, such that the strain induced in the first member 104 squeezes the second member 106 between the force-applying surface of the first member 104 and the fixture 110. Alternatively, the first member 104 can have its force-applying surface indirectly coupled to the second member 106, for example, by way of one or more intervening members (e.g., as shown in FIGS. 14B-14C). Thus, strain induced in the first member 104 would squeeze the second member 106 between the contacting surface of one of the intervening members and the fixture 110.

In some embodiments, the first member 104 can include additional materials besides the first material, and/or the second member 106 can include additional materials besides the second material. For example, one of the first member 104 and second member 106 can include a thermal insulating material that separates the elastocaloric material of the second member 106 from other materials. When included in one or both the first 104 and second 106 members, the thermal insulating material can have sufficient mechanical properties so as to transmit most or at least a majority of the strain from the first material of the first member 104 to the elastocaloric material of the second member 106. For example, deformation exhibited by the thermal insulating material may be less than 10% of that exhibited by the first material or the elastocaloric material. In a fabricated embodiment, yttria-tetragonal zirconia polycrystal (Y-TZP) ceramic discs were used as the thermal insulating material to insulate the elastocaloric material from the surrounding thermal mass. The Y-TZP ceramic discs had a compressive strength of 2300 MPa and a modulus of elasticity of 205 GPa. Other suitable thermal insulating materials are also possible according to one or more contemplated embodiments.

The application of stress 116 to the second member 106 by the first member 104 may be considered a charging or loading phase of the composite device 102. Depending on temporal characteristics of the applied field 114 and resulting stress 116, the phase transformation of the elastocaloric material of the second member 106 in the loading phase can result in the release of latent heat 118. However, as described elsewhere herein, the temporal characteristics of the applied field 114 can be controlled in the loading phase to avoid, or at least reduce, the amount of heat 118 released by the second member 106, for example, by increasing a magnitude of the applied field 114 gradually over time.

To provide a desired cooling effect after loading of the composite device 102, the applied field 114 is removed or terminated. The removal of the field 114 may be abrupt or at least occur over a time scale that is much smaller (e.g., at least an order of magnitude smaller) than that for the original application of the field 114. The first member 104 thus reverts back to its original shape, e.g., length $L_0$, thereby removing the stress 116 applied to the second member 106. The stress removal allows the elastocaloric material of the second member 106 to transition back to its original state, which transition causes the elastocaloric material to absorb heat 120 from its surroundings. A temporary cooling effect is provided to the environment or a target in thermal contact with the second member 106.

Although only a single composite device 102 and source 112 are illustrated in FIG. 1, embodiments of the disclosed subject matter are not limited thereto. Indeed, as noted above, a cooling system may include multiple composite devices 102 to provide more continuous cooling. In such configurations, the composite devices may each have their own respective electric/magnetic source, or one or more of the multiple composite devices may share one or more common electric/magnetic sources.

The cooling system 100 can be adapted for use in a variety of applications and may be particularly useful in applications where remote (i.e., non-contact or wireless) cooling or compact structure are beneficial. Such applications include, but are not limited to, cooling of integrated electronic components, photon detectors, sonar sensors, or other electronic devices; operation as a component in a thermodynamic cycle, for example, as a microrefrigerator; and ex vivo or in vivo biological applications, such as remote-controlled localized cooling within the brain to treat epileptic seizures.

Figure 2:
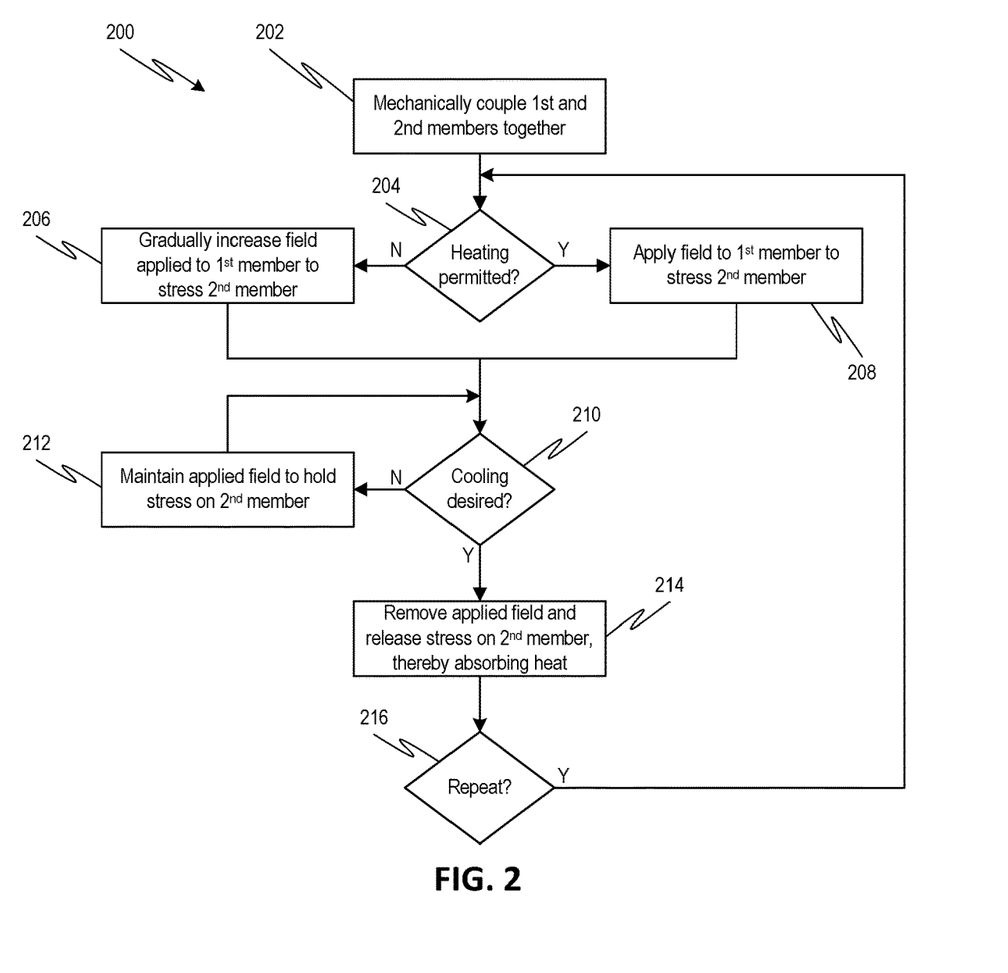
FIG. 2 is a process flow diagram for a cooling method using the composite elastocaloric device, according to one or more embodiments of the disclosed subject matter.

FIG. 2 illustrates an exemplary method 200 employing the composite device 102 of FIG. 1 to provide cooling. The method 200 can optionally begin at 202, where the first member 104 and the second member 106 are mechanically coupled together. As noted above, the mechanical coupling may be direct (i.e., with a surface of the first member contacting an adjacent surface of the second member) or indirect (i.e., with one or more intervening members disposed between the first member and the second member). The mechanical coupling 202 can further include installing the first and second members in contact with their respective fixtures 108, 110. In some embodiments, the installation between the fixtures 108, 110 may serve to preload (i.e., stress or strain without any field application) the first member 104 and/or the second member 106. As noted above, the fixtures 108, 110 may be parts of a rigid support frame, in which case the mechanical coupling 202 includes positioning the first 104 and second 106 members within the support frame.

The method 200 can then proceed to or optionally begin at 204, where it is determined if heating is permitted. As noted above, the manner of field application and resulting stress can dictate whether the elastocaloric material of the second member 106 releases heat. Indeed, in some cooling applications, such heat release may be undesirable. If heating is to be avoided, the method 200 can proceed to 206, where the applied electric or magnetic field is increased over an extended period of time. Increasing the applied field over an extended period of time in 206 can help avoid, or at least reduce, heat release 118 from the elastocaloric material due to stress 116 and/or maintain a temperature of the elastocaloric material substantially constant.

For example, the applied electric or magnetic field may be gradually increased from zero to a peak value over 20-60 seconds. However, the time for increasing the field while keeping the composite device 102 and/or the surrounding environment isothermal is a function of the heat capacity of the surrounding environment. Accordingly, other times for increasing the field are also possible according to one or more contemplated embodiments. In general, the period of time over which the field is increased in 206 is at least an order of magnitude larger than the period of time over which the field is subsequently removed to generate cooling in 214. Moreover, the increase of the field in 206 need not be a continuous increase or increase at a constant rate. Rather, in some embodiments, the applied field may increase in incremental steps over an extended period of time.

In other cooling applications, heat release 118 may be inconsequential or incorporated as part of a thermodynamic cycle, e.g., as part of the heat-rejection part of the cycle. Alternatively, the composite device 102 can be used in a "single shot at a time" mode, for example, as described in U.S. Patent Application Publication No. 2015/0316327, which is incorporated by reference herein. In such an application, the composite device 102 can undergo loading by the applied field at a location different from where cooling is desired. After loading, the composite device 102 can be delivered to the cooling location ready as part of 210 in order to provide adiabatic cooling at 214. In such cases, the method 200 can proceed from 204 to 208, where the applied electric or magnetic field is applied rather abruptly, for example, by increasing from zero to a peak value in less than 1 second. The abrupt field application and the resulting abruptly applied stress 116 results in heat release 118 from the elastocaloric material. After either 206 or 208 (i.e., the loading phase of the composite device 102), the method 200 can proceed to 210, where it is determined if cooling is desired.

If the system is not yet ready for cooling, for example, if another composite device 102 is currently providing cooling to the target, or if a time for cooling has not yet arrived (e.g., if an in vivo system is awaiting occurrence of an epileptic seizure before providing cooling), the method 200 can proceed to 212 (i.e., an intermediate or queuing phase). At 212, the applied field is maintained such that the second member 106 continues in the stressed state until needed.

Otherwise, if cooling is desired at 210, the method 200 can proceed to 214, where the field 114 applied to the first member 104 is removed rather abruptly, for example, by decreasing from the peak value to zero in less than 1 second.

The abrupt removal of the field 114 allows the first member 104 to revert to its original size, thereby removing the stress 116 and allowing the elastocaloric material of the second member 106 to transition back to its original state. This transition of the elastocaloric material causes it to absorb, heat 120 and/or decrease in temperature. For example, the release of stress can cause a decrease in temperature of the elastocaloric material of at least 3K.

The cooling effect generated by the elastocaloric material absorbing heat 120 at 214 (i.e., the unloading or cooling phase) is only temporary. To provide additional cooling at 216, the loading and unloading phases can be repeated by returning to 204. Alternatively or additionally, multiple composite devices 102 can be simultaneously operated in parallel according to method 200. In such simultaneous operation, the timing between the same operational phases of the composite devices can be delayed, such that one or more of the composite devices provides cooling (e.g., via operation at 214 in FIG. 2) while other composite devices are being loaded (e.g., via operation at either 206 or 208) or queued (e.g., via operation at 212) in preparation for cooling. This operation allows multiple composite devices to be used to provide continuous or substantially continuous cooling.

Figure 3:
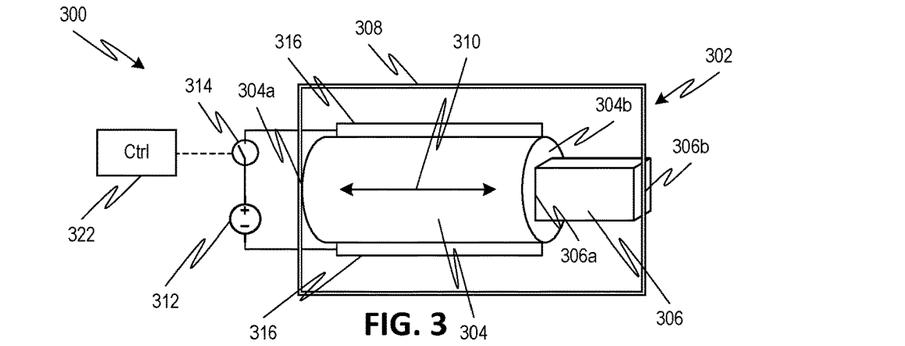
FIG. 3 is a simplified schematic diagram of a first embodiment of the composite elastocaloric device employing a piezoelectric material.

Referring to FIG. 3, an exemplary cooling system 300 employing a composite device 302 according to a piezo-elastocaloric configuration is illustrated. The composite device 302 includes first member 304 and elastocaloric member 306 mechanically coupled together. In particular, the first member 304 can have a force-applying surface 304b in direct contact with an adjacent surface 306a of the elastocaloric member 306. The composite device 302 can further include a rigid support frame 308 that contacts surface 304a of the first member 304 and surface 306b of the elastocaloric member 306 to restrain motions thereof. Accordingly, any change in length (e.g., along direction 310) of the first member 304 is directly conveyed to the elastocaloric member 306. Thus, when the first member 304 increases in length, the elastocaloric member 306 is subjected to compressive stress between surface 304b of the first member 304 and the support frame 308 contacting surface 306b.

The first member 304 comprises a piezoelectric material, which expands along longitudinal direction 310 when an electric field is applied between electrodes 316 attached to the first member 304. For example, the piezoelectric material can be a single crystal or polycrystal of lead magnesium niobate-lead titanate $[Pb(Mg_{1/3}Nb_{2/3})O_3]$—$[PbTiO_3]$ (PMN-PT), lead zinc niobate-lead titanate $[Pb(Zn_{1/3}Nb_{2/3})O_3]$—$[PbTiO_3]$ (PZN-PT), or lead indium niobate-lead magnesium niobate-lead titanate $[Pb(In_{1/2}Nb_{1/2})O_3]$—$[Pb(Mg_{1/3}Nb_{2/3})O_3]$—$[PbTiO_3]$ (PIN-PMN-PT). The elastocaloric material 306 can be, for example, a copper-based SMA, such as, copper aluminum manganese (Cu—Al—Mn), copper aluminum nickel (Cu—Al—Ni), or copper zinc aluminum (Cu—Zn—Al).

The system 300 further includes a DC voltage source 312 connected to electrodes 316 for applying an electric field to the first member 304 to load the composite device 302 in preparation for cooling. The system 300 can have a controller 322 operatively connected to an electrical switch 314 in order to control application of the electric field. The controller 322 may also be provided with (or receive signals from) sensors that monitor temperature or other operational parameters to determine if/when cooling is required. Of course, components and methodologies other than the controller 322 and switch 314 arrangement for controlling application of the electric field from source 312 are also possible according to one or more contemplated embodiments.

As discussed above, the composite device 302 is loaded by applying a field to the first member 304 that causes elongation thereof along longitudinal direction 310, thereby subjecting the elastocaloric material 306 to compressive stress between force-applying surface 304b and the support frame 308. To provide cooling, the field is rapidly removed, for example, by opening switch 314. The first member 304 reverts to its original size, thereby removing stress from the elastocaloric member 306 and causing it to absorb heat. The surface 306b of the elastocaloric material 306 (or a surface of the support frame 308 adjacent to surface 306b) can be considered a cooling surface, where heat is absorbed by the elastocaloric material 306 from the surrounding environment or a target structure in thermal contact with the surface 306b.

Figure 4:
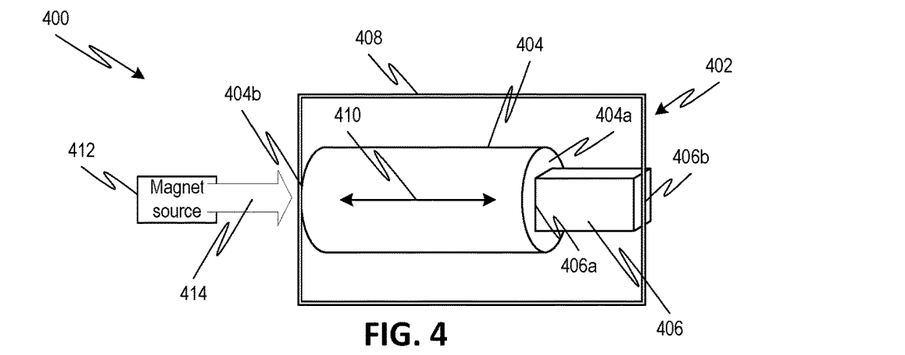
FIG. 4 is a simplified schematic diagram of a second embodiment of the composite elastocaloric device employing a magnetostrictive material.

Referring to FIG. 4, an exemplary cooling system 400 employing a composite device 402 according to a magneto-elastocaloric configuration is illustrated. The composite device 402 includes first member 404 and elastocaloric member 406 mechanically coupled together. In particular, the first member 404 can have a force-applying surface 404a in direct contact with an adjacent surface 406a of the elastocaloric member 406. The composite device 402 can further include a rigid support frame 408 that contacts surface 404b of the first member 404 and surface 406b of the elastocaloric member 406 to restrain motions thereof. Accordingly, any change in length (e.g., along direction 410) of the first member 404 is directly conveyed to the elastocaloric member 406. Thus, when the first member 404 increases in length, the elastocaloric member 406 is subjected to compressive stress between surface 404a of the first member 404 and the support frame 408 contacting surface 406b.

The first member 404 comprises a magnetostrictive material, which expands along longitudinal direction 410 when a magnetic field 414 is applied from source 412 to the first member 404 with an orientation (i.e., from one pole to the other pole) substantially aligned with the longitudinal direction 410. For example, the magnetostrictive material can be terbium dysprosium iron alloy (Terfenol-D), iron gallium alloy (Galfenol), iron aluminum alloy (Alfenol), iron silicon boron carbon alloy, or cobalt ferrite. The elastocaloric material 406 can be, for example, a copper-based SMA, such as, copper aluminum manganese (Cu—Al—Mn), copper aluminum nickel (Cu—Al—Ni), or copper zinc aluminum (Cu—Zn—Al).

As discussed above, the composite device 402 is loaded by applying the magnetic field 414 to the first member 404, which causes elongation thereof (i.e., magnetostrictive strain) along longitudinal direction 410, thereby subjecting the elastocaloric material 406 to compressive stress between force-applying surface 404a and the support frame 408. The source 412 of the magnetic field 414 can include one or more permanent magnets, one or more electromagnets, or a combination thereof.

To provide cooling, the magnetic field 414 from source 412 is rapidly removed. When source 412 includes permanent magnets, removal of the field 414 may be achieved by relative displacement between the composite device 402 and the source 412. For example, a controller and/or actuator (e.g., linear or rotary motor) can be used to displace one of the source 412 and the device 402 with respect to the other to position the device 402 outside the field 414 or to misalign the orientation of the field 414 with the longitudinal direction 410 of the first member 404. Alternatively or additionally, a magnetic shield (not shown) can be positioned between the composite device 402 and the source 412 to prevent field 414 from reaching the first member 404. When source 412 includes electromagnets, removal of the field 414 may be achieved by removing electrical power from the source 412. Other components and methodologies besides those discussed above for controlling application of the magnetic field 414 are also possible according to one or more contemplated embodiments.

Once the field 414 is removed, the first member 404 reverts to its original size, thereby removing stress from the elastocaloric member 406 and causing it to absorb heat. The surface 406b of the elastocaloric material 406 (or a surface of the support frame 408 adjacent to surface 406b) can be considered a cooling surface, where heat is absorbed by the elastocaloric material 406 from the surrounding environment or a target structure in thermal contact with the surface 406b. The applied field 414 can have a magnitude of 0.3 T or less, and the temperature change produced by the composite device 402 upon removal of the applied field 414 can be at least 3K.

In one or more examples fabricated according to the configuration of FIG. 4, the magnetostrictive material comprises Terfenol-D having a formula of $Tb_{0.3}Dy_{0.7}Fe_{1.92}$, and the elastocaloric material comprises a single crystal Cu—Al—Mn SMA ($Cu_{72}Al_{17}Mn_{11}$ (at. %)). The Terfenol-D can provide strain as large as 2000 ppm (e.g., 800-1200 ppm) with a load stress as large as 880 MPa, while the Cu—Al—Mn SMA can undergo transformation with stress as low as 100 MPa and provide an adiabatic temperature change ($\Delta T_{ad}$) as large as 12.8K. When the Terfenol-D and Cu—Al—Mn were elastically coupled together in a fabricated composite device 402, the magnetic-field-induced elastocaloric effect (referred to herein as magneto-elastocaloric or M-eC) was able to produce cooling $\Delta T_{ad}$ of 4.4K after loading with a magnetic field of 0.16 T. In contrast, existing cooling devices that employ magnetocaloric materials require a relatively large magnetic field (e.g., 2 T) to induce $\Delta T_{ad}$ of 5.4K.

In the fabricated examples, the first member was formed from a pair of magnetostrictive rods of Terfenol-D alloy. The magnetostrictive rods had a diameter of 6 mm and lengths of 77 mm and 38 mm, respectively. A high-strength aluminum frame was used to house the magnetostrictive alloy and the elastocaloric SMA of the second member. The frame had an outer diameter of 28 mm and an inner diameter of 19.2 mm, with brass knob end caps that were used to tailor a pre-stress load applied to the magnetostrictive alloy and the elastocaloric SMA. The combined length of the magnetostrictive rods (i.e., 115 mm) was able to produce a maximum load of 300N on the elastocaloric SMA within the aluminum frame.

To generate sufficient stress for phase transformation from the 300N load, the Cu—Al—Mn SMA was formed with a cross-sectional area substantially less than that of the Terfenol-D alloy. In particular, the Terfenol-D rod had a cross-sectional area of 28.2 $mm^2$, while the cross-sectional area of the Cu—Al—Mn SMA was 2 $mm^2$. The Cu—Al—Mn SMA was formed as a rectangular specimen having dimensions of 2 mm×1 mm×2 mms, with the 2 mm length thereof along the [110] crystallographic orientation. A polyimide ring was disposed within the aluminum frame in order to guide the multiferroic composite for avoiding lateral deformation. In addition, ceramic disks were inserted to insulate the Cu—Al—Mn SMA from the surrounding thermal mass. The disks were formed of an yttria-tetragonal zirconia polycrystal ceramic.

Figure 5:
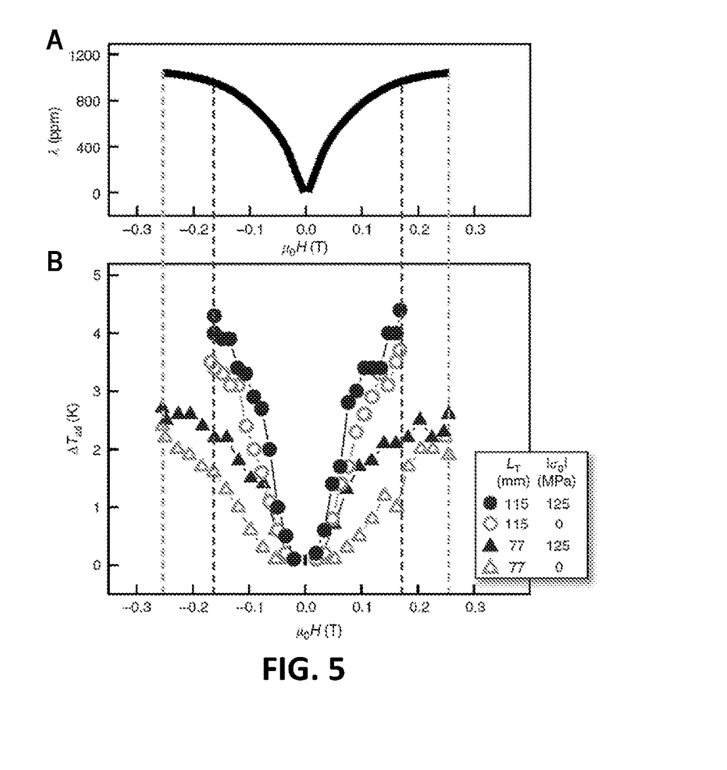
FIG. 5 are graphs illustrating strain of the magnetostrictive material (panel A) and the resulting cooling of the elastocaloric material (panel B) as a function of applied magnetic field for the composite elastocaloric device of the second embodiment.

FIG. 5 illustrates results obtained with fabricated M-eC composite devices. In particular, panel A of FIG. 5 shows the magnetostrictive strain, $\lambda$, produced by the Terfenol-D magnetostrictive material as a function of the applied magnetic field, $\mu_0 H$, while panel B of FIG. 5 shows the corresponding cooling by the Cu—Al—Mn SMA elastocaloric material that results from rapidly removing the corresponding magnetic field from the Terfenol-D. The data in panel B was obtained using two different lengths, $L_T$, for the Terfenol-D, in particular, 77 mm (obtained using only one of the above noted rods) and 115 mm (obtained using both of the above noted rods in combination). The data in panel B was also obtained using two different pre-stress values, $\sigma_0$, in particular, 0 and 125 MPa. Note that the pre-stress refers to the stress level on the elastocaloric material prior to application of the magnetic field to the magnetostrictive material.

As demonstrated by FIG. 5, the strain of the Terfenol-D is fully recoverable. The transformation volume fraction determines the released (and absorbed) latent heat by the Cu—Al—Mn SMA, which in turn controls the ultimate cooling $\Delta T_{ad}$ in the SMA. Different $\Delta T_{ad}$ in panel B of FIG. 5 were attained by rapidly unloading from different strain levels. As shown in panel A of FIG. 5, a magnetostriction of 930 ppm for the Terfenol-D can be achieved at 0.16 T, which can be used to attain $\Delta T_{ad}$ in the M-eC device as large as 4.4 K as shown in panel B of FIG. 5. Larger $\Delta T_{ad}$ can be obtained by employing a more rigid device frame than the fabricated aluminum frame. As shown in FIG. 5, longer Terfenol-D pieces yield larger strain values, and a preloaded stress to the Cu—Al—Mn piece also leads to a larger strain, which yields larger observed $\Delta T_{ad}$.

Figure 6:
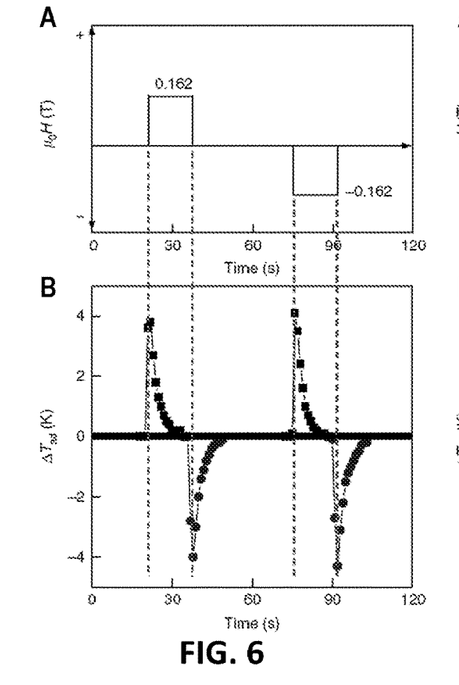
FIG. 6 are graphs illustrating waveforms of the applied magnetic field (panel A) and corresponding adiabatic temperature change of the elastocaloric material (panel B) for operation of the composite elastocaloric device of the second embodiment.
Figure 7:
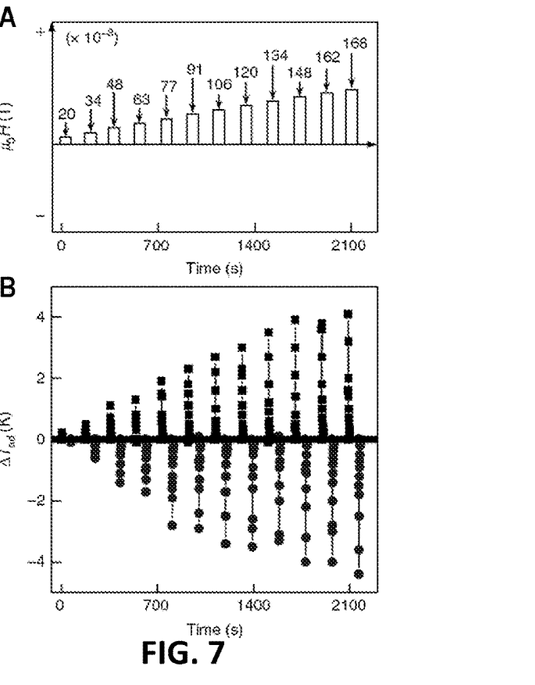
FIG. 7 are graphs illustrating waveforms of the applied magnetic fields of different magnitude (panel A) and corresponding adiabatic temperature change of the elastocaloric material (panel B) for operation of the composite elastocaloric device of the second embodiment.

FIGS. 6-7 illustrate further results obtained with fabricated M-eC composite devices. In particular, panel A of FIGS. 6-7 shows the waveform of the magnetic field, $\mu_0 H$, applied to the Terfenol-D magnetostrictive material, while panel B of FIGS. 6-7 shows the corresponding adiabatic temperature change, $\Delta T_{ad}$, of the Cu—Al—Mn SMA elastocaloric material. The M-eC composite device included the 115 mm long Terfenol-D rod and had a pre-stress of 125 MPa applied to the Cu—Al—Mn SMA. As illustrated in FIGS. 6-7, rapid application and removal of the magnetic field (whether positive or negative values) yields heating and cooling, respectively, followed by a natural settling back to room temperature. Moreover, FIG. 7 demonstrates that the amount of cooling directly corresponds (i.e., increases linearly) to the magnitude of the applied magnetic field.

FIGS. 5-7 thus demonstrate that the fabricated M-eC composite devices are capable of providing cooling using relatively low magnetic fields. In contrast, existing cooling devices employing magnetocaloric materials require substantially higher magnetic fields. For example, while the inventive M-eC device can obtain an adiabatic temperature change of 4K using a magnetic field of 0.16 T, a cooling device employing FeRh would require 0.6 T to achieve a 4K temperature change. For other magnetocaloric materials such as Mn—Fe—P—As or Ni—Mn—In, fields in excess of 1 T are required.

Figure 8:
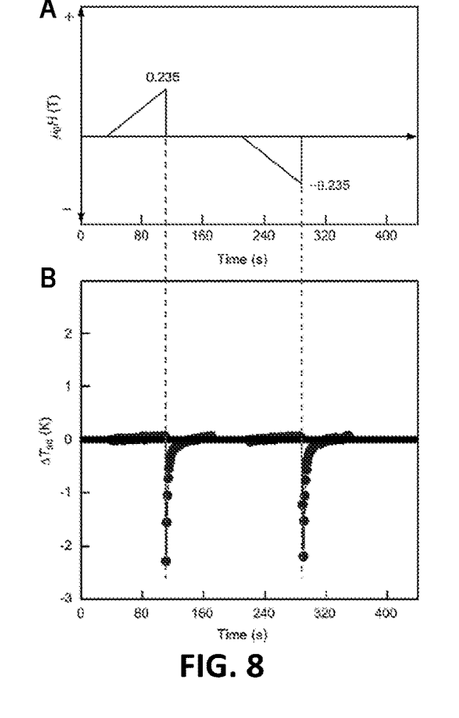
FIG. 8 are graphs illustrating waveforms of the applied magnetic field (panel A) and corresponding adiabatic temperature change of the elastocaloric material (panel B) for operation of the composite elastocaloric device of the second embodiment to avoid heating of the elastocaloric material.
Figure 9:
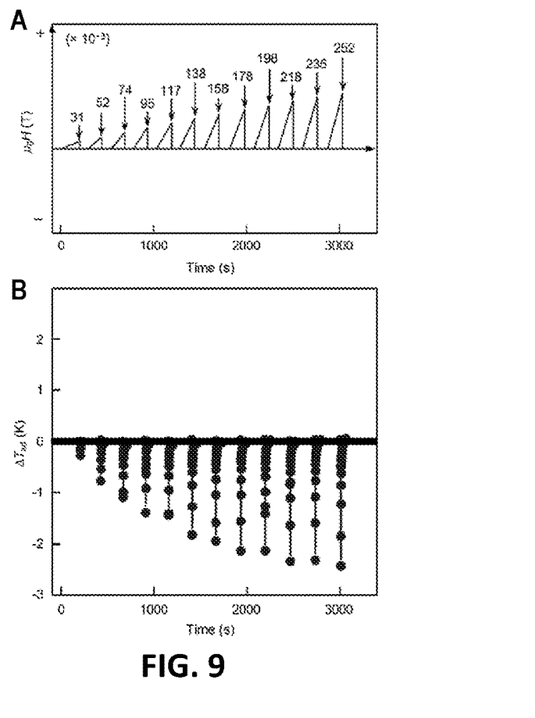
FIG. 9 are graphs illustrating waveforms of the applied magnetic fields of different magnitude (panel A) and corresponding adiabatic temperature change of the elastocaloric material (panel B) for operation of the composite elastocaloric device of the second embodiment to avoid heating of the elastocaloric material.

As evidenced by FIGS. 6-7, rapid application of the magnetic field results in temporary heating by the Cu—Al—Mn SMA. In some applications, such heating may be undesirable and can be avoided by slowly increasing the magnetic field, as described above. For example, FIGS. 8-9 illustrate further results obtained with fabricated M-eC composite devices, where the magnetic field loading is carried out slowly and the field removal is carried out rapidly. In particular, panel A of FIGS. 8-9 shows the triangular waveform of the magnetic field, $\mu_0 H$, applied to the Terfenol-D magnetostrictive material, while panel B of FIGS. 8-9 shows the corresponding adiabatic temperature change, $\Delta T_{ad}$, of the Cu—Al—Mn SMA elastocaloric material. The M-eC composite device included the 115 mm long Terfenol-D rod and had a pre-stress of 125 MPa applied to the Cu—Al—Mn SMA.

As illustrated in FIGS. 8-9, the gradual application of the magnetic field (whether positive or negative values) avoided significant heating during the loading phase, while the abrupt removal of the magnetic field at the end of the triangular waveform yielded substantial cooling followed by a natural settling back to room temperature. Moreover, FIG. 9 again demonstrates that the amount of cooling directly corresponds (i.e., increases linearly) to the peak magnitude of the applied magnetic field. Although a triangular waveform is illustrated in panel A of FIGS. 8-9, other waveforms for increasing the magnitude of the applied magnetic field over time are also possible according to one or more contemplated embodiments. For example, the temporal shape of the applied magnetic field may include multiple incremental steps, an exponential or parabolic curve, or any other curve that increases over time.

Figure 10:
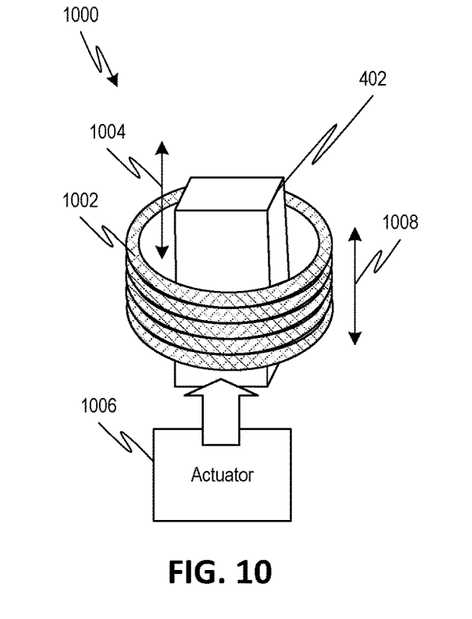
FIG. 10 is a simplified schematic diagram of a first testing setup for demonstrating cooling by a system employing permanent magnetic rings and the composite elastocaloric device of the second embodiment.
Figure 11A:
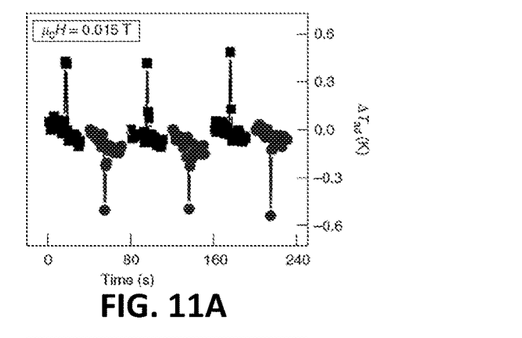
FIGS. 11A-11B are graphs of measured temperature change in the first testing setup of FIG. 10 using ferrite magnetic rings and Nd—Fe—B magnetic rings, respectively.
Figure 11B:
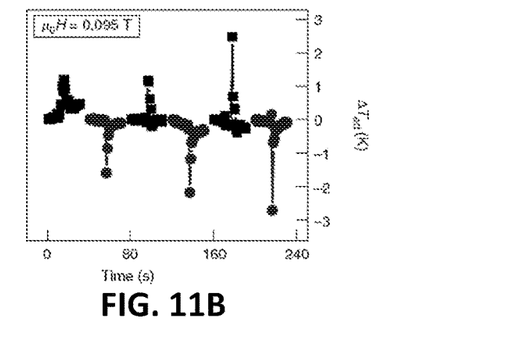

To illustrate the design flexibilities and simple implementation of the M-eC effect, exemplary setups were tested using relative motion of the fabricated M-eC composite device with respect to permanent magnets to achieve periodic cooling. For example, FIG. 10 illustrates a first exemplary setup 1000, where a stacked array 1002 of permanent magnet rings were used to apply a magnetic field (having an orientation 1008 from one pole to the opposite pole) to the M-eC composite device 402. An actuator 1006 (e.g., a reciprocating linear actuator) was used to move the composite device 402 along its longitudinal direction 1004 to be within the magnetic field of the magnet array 1002 for loading or outside of the magnetic field for cooling. The resulting adiabatic temperature changes $\Delta T_{ad}$ produced by the M-eC composite device 402 using the field from permanent magnets 1002 formed of ferrite magnets ($\mu_0 H=0.015$ T) and of Nd—Fe—B magnets ($\mu_0 H=0.095$ T) is shown in FIGS. 11A-11B, respectively.

Figure 12:
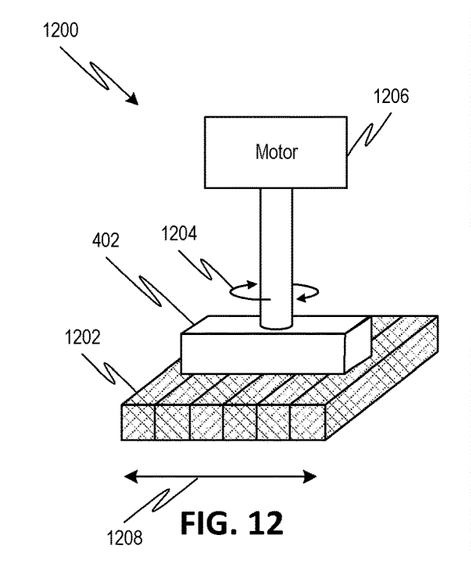
FIG. 12 is a simplified schematic diagram of a second testing setup for demonstrating cooling by a system employing permanent magnetic bars and the composite elastocaloric device of the second embodiment.
Figure 13A:
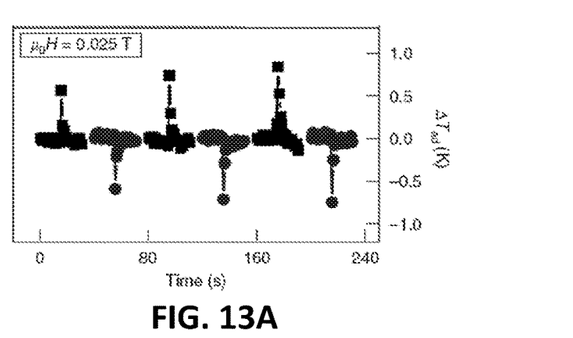
FIGS. 13A-13B are graphs of measured temperature change in the second testing setup of FIG. 12 using ferrite magnetic rings and Nd—Fe—B magnetic rings, respectively.
Figure 13B:
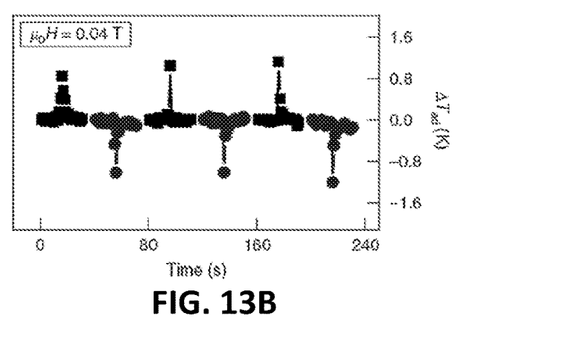

FIG. 12 illustrates a second exemplary setup 1200, where a linear array 1202 of permanent magnet bars were used to apply a magnetic field (having an orientation 1208 from one pole to the opposite pole) to the M-eC composite device 402. An actuator 1206 (e.g., a rotational motor) was used to rotate the composite device about an axis perpendicular to its longitudinal axis. As the composite device 402 rotates in direction 1204 the longitudinal axis is periodically aligned and then misaligned with the field orientation 1208 of the bar magnets, thereby loading (when aligned) and cooling (when misaligned). The resulting adiabatic temperature changes $\Delta T_{ad}$ produced by the M-eC composite device 402 using the field from permanent magnets 1202 formed of ferrite magnets ($\mu_0 H=0.025$ T) and of Nd—Fe—B magnets ($\mu_0 H=0.04$ T) is shown in FIGS. 13A-13B, respectively.

In one or more embodiments of the disclosed subject matter, multiple composite devices can be used as components in a conventional thermodynamic cycle (e.g., heat pump), together with heat exchangers and other components. Any heat generated during the loading of the composite devices can be handled by the standard heat-rejection part of the cycle. In such a configuration, the multiple composite devices may employ a reciprocating work recovery mechanism, such as that disclosed in U.S. Pat. No. 10,018,385, which is hereby incorporated by reference herein.

Alternatively or additionally, multiple composite devices can be alternately operated to provide cooling over a longer period, and preferably continuous or substantially continuous cooling. For example, composite devices can be mechanically coupled together in a linear fashion as illustrated in the first exemplary configuration 1400 in FIG. 14A. A first composite device is formed by first member 104a and elastocaloric member 106a, and is restrained at one end by fixture 108a and at the opposite end by surface 1402a of shared fixture 1402. A second composite device is formed by first member 104b and elastocaloric member 106b, and is restrained at one end by fixture 108b and at the opposite end by surface 1402b of shared fixture 1402. For example, fixtures 108a, 108b, and 1402 may be part of a common support frame. The first and second composite devices are coupled at facing surfaces of the elastocaloric materials 106a, 106b.

In an exemplary operation of system 1400, the first members 104a, 104b are alternately actuated by respective sources 112a, 112b to load the respective composite device. For example, the source 112a, 112b can be an electromagnet, with a coil of wire wrapped around the respective first member 104a, 104b. Although shown as separate components 112a, 112b, it is also possible that a single source 112 can be used instead, with the field from the source 112 being alternately applied to the respective first members 104a, 104b.

Thus, in a first phase, an electric or magnetic field 114a is applied from source 112a to first member 104a while no field 114b is applied from source 112b to first member 104b. The applied field 114a causes the first member to elongate and compress the second member 106a against fixture surface 1402a (i.e., loading the first composite device). In a subsequent second phase, the applied field 114a is removed, while field 114b is applied from source 112b to the first member 104b. The applied field 114b causes the first member 104b to elongate and compress the second member 106b against fixture surface 1402b (i.e., loading the second composite device). At the same time, the field 114a is removed from the first member 104a, allowing it to revert back to its original length and release compression of the second member 106a. The stress release from the second member 106a causes a phase transition therein and corresponding heat absorption to provide cooling. These first and second phases can repeatedly alternate, such that one of the second members 106a, 106b provides cooling while the other of the second members 106a, 106b undergoes loading in preparation for subsequent cooling.

In an alternative exemplary operation of system 1400, the first members 104a, 104b are simultaneously subject to respective fields 114a, 114b in order to load the second members 106a, 106b of the respective composite devices (i.e., loading phases). Similarly, the first members 104a, 104b can have their respective fields 114a, 114b removed at the same time to provide simultaneous cooling by both the second members 106a, 106b (i.e., cooling phases). In such simultaneous operation, the amount of cooling provided by system 1400 can be increased as compared to the alternating operation, albeit at the expense of only providing an intermittent cooling effect rather than a continuous cooling effect.

In a second exemplary configuration 1420 illustrated in FIG. 14B, a pair of composite devices are coupled together via a movable plate 1422 for reciprocating operation. A first composite device is formed by first member 104a and elastocaloric member 106a, and is restrained at one end of the first member 104a by fixture 108a and at an opposite end of the elastocaloric member 106a by fixture 110a. A second composite device is formed by first member 104b and elastocaloric member 106b, and is restrained at one end of the first member 104a by fixture 108b and at an opposite end of the elastocaloric member 106b by fixture 110b. The movable plate 1422 is coupled between the facing surfaces of the first members 104a, 104b and the facing surfaces of the elastocaloric members 106a, 106b.

The first members 104a, 104b are alternately actuated by respective sources 112a, 112b to load the respective composite device. For example, the source 112a, 112b can be an electromagnet, with a coil of wire wrapped around the respective first member 104a, 104b. Although shown as separate components 112a, 112b, it is also possible that a single source 112 can be used instead, with the field from the source 112 being alternately applied to the respective first members.

In a first phase, an electric or magnetic field 114a is applied from source 112a to first member 104a while no field 114b is applied from source 112b to first member 104b. This causes extension of the first member 104a to stress (and thereby load) elastocaloric member 106a. In a subsequent second phase, field 114a from source 112a is terminated and field 114b from source 112b is applied to first member 104b. This causes extension of the first member 104b to stress (and thereby load) elastocaloric member 106b, while the other elastocaloric member 106a is de-stressed and exhibits cooling.

In FIG. 14B, the first members 104a, 104b and the elastocaloric members 106a, 106b are arranged with each other along respective lines. However, other arrangements are also possible according to one or more contemplated embodiments. For example, FIG. 14C illustrates an alternative configuration 1440 to that of FIG. 14B. In FIG. 14C, the first member 104a and elastocaloric member 106a are arranged on a common line, while the other first member 104b and elastocaloric member 106b are arranged on a separate common line. Operation of the configuration 1440 is otherwise the same as that of FIG. 14B.

In FIGS. 14B-14C, the mechanical coupling between first members 104a, 104b and elastocaloric members 106a, 106b via movable plate 1422 may serve to coordinate loading/unloading of stress/strain, for example, to allow work previously expended to load one composite device to be recovered for use in loading another composite device. For example, each of the first members 104a, 104b and/or second members can be preloaded with strain such that the unloading of one of the composite devices during its cooling phase assists in loading the other composite device during its loading phase. In particular, each composite device can have the amount of deformation (e.g., strain) but with opposite magnitude, such that a combined length of the combined composite devices remains constant.

For example, the second member 106a is preloaded to 50% strain in tension, and thus the second member 106b undergoes a preloaded 50% strain in compression. Alternatively or additionally, the first member 104a can be preloaded to 50% strain in tension, and thus the first member 106a undergoes a preloaded 50% strain in compression. When the first members comprise a magnetostrictive material, such preloading involves simultaneously applying magnetic field to the magnetostrictive material of the first member 104a to generate negative 50% strain and removing magnetic field from the magnetostrictive material of the first member 104b to generate positive 50% strain. When the first members comprise a piezoelectric material, such preloading involves simultaneously applying electric field to the piezoelectric material of the first member 104a to generate negative 50% strain and removing electric field from the piezoelectric material of the first member 104b to generate positive 50% strain.

Figure 15A:
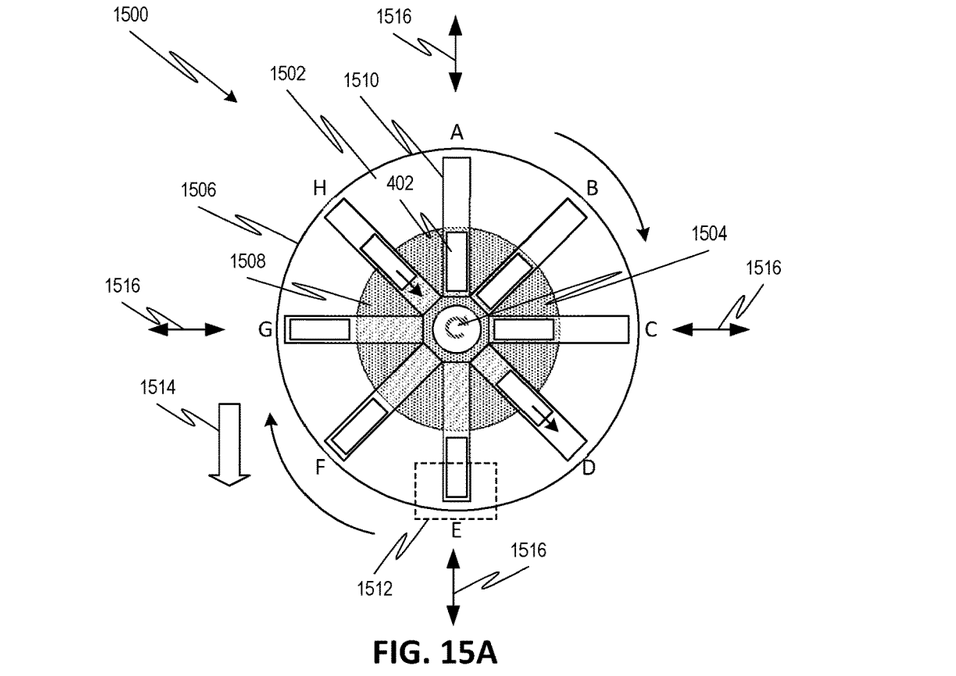
FIG. 15A is a simplified schematic diagram of a fourth exemplary cooling system configuration employing multiple composite elastocaloric devices of the second embodiment.

In one or more embodiments of the disclosed subject matter, an array of composite devices can be sequentially actuated (e.g., positioned with respect to a static magnetic field) to provide cooling over a longer period, and preferably continuous or substantially continuous cooling. For example, FIG. 15A illustrates an exemplary configuration 1500 employing a support disk 1502 for positioning M-eC composite devices 402 with respect to magnet 1508. The magnet can be a radially-poled toroidal magnet, with field orientation 1516.

Support disk 1502 can be rotated about its center 1504 by an appropriate motor (not shown). The support disk 1502 can include a plurality of radially extending support paths 1510, in which M-eC composite devices 402 are movably retained. The support disk 1502 can be vertically oriented, such that the plane in which it rotates is parallel to the direction of gravity 1514. Gravity can thus be used to passively position the M-eC composite devices 402 within the respective support path 1510 as the support disk 1502 rotates.

In particular, at position A, gravity 1514 pulls the composite device 402 to the bottom of its support path 1510, adjacent to the disk center 1504 and within the magnetic field of the magnet 1508. The magnetic field applied to the composite device 402 at position A (and similarly at positions B-C) causes the magnetostrictive material therein to increase in size, thereby stressing the elastocaloric material therein in preparation for cooling. As the support disk 1502 rotates clockwise and the support path 1510 originally at position A moves past position C, gravity 1514 acts on the composite device 402 in support path 1510 to begin pulling it away from the center 1504. At position D, gravity 1514 continues to act on the composite device 402 to pull it towards the perimeter 1506 of the support disk 1502 and outside the magnetic field of magnet 1508. At position E, the composite device 402 has displaced to the end of the support path 1510 adjacent to the perimeter 1506.

Similarly, gravity 1514 acts on the composite device 402 in support path 1510 as it moves past position G to begin pulling it toward the center 1504. At position H, gravity 1514 continues to act on the composite device 402 to pull it toward the center 1504 of the support disk 1052 and into the magnetic field of magnet 1508. At position A, the composite device 402 has displaced to the end of the support path 1510 adjacent to the center 1504 and is ready to begin the cycle again.

Since the magnetic field has been effectively removed from the composite device 402 at position E, the magnetostrictive material within the composite device 402 reverts to its previous size, thereby releasing stress on the elastocaloric material therein and providing a cooling effect to cooling zone 1512. Meanwhile, other devices 402 at respective positions A-C are being loaded by magnetic field application and will provide subsequent cooling as they rotate to position E. In this manner, cooling zone 1512 may experience substantially continuous cooling by sequential supply and automatic positioning of loaded composite devices 402 to position E.

Figure 15B:
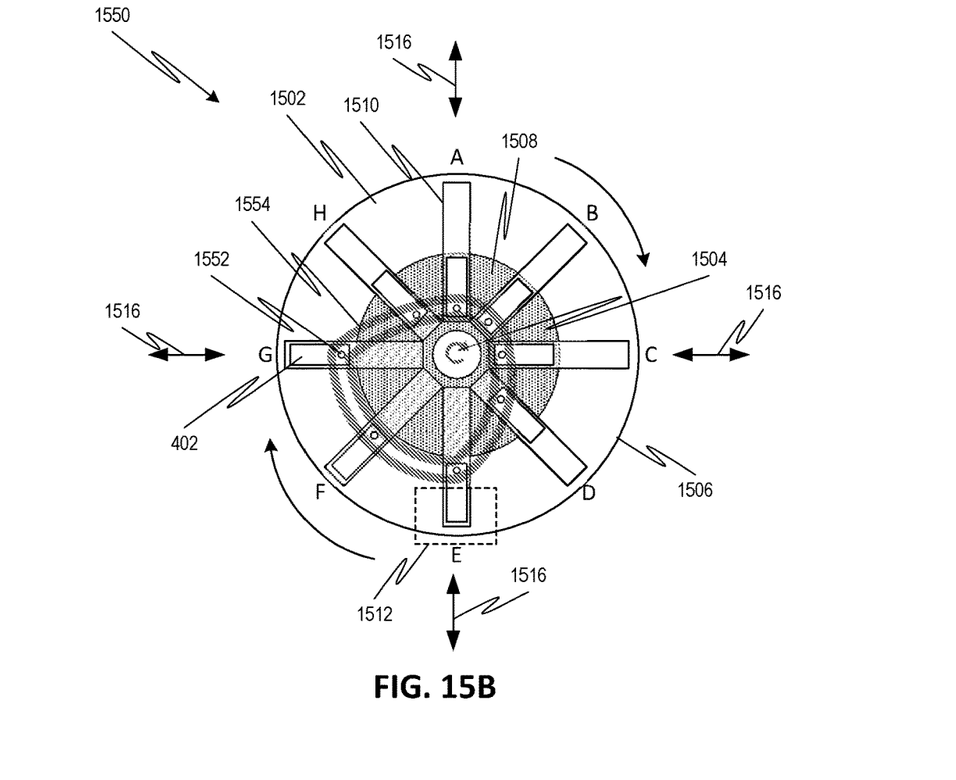
FIG. 15B is a simplified schematic diagram of a fifth exemplary cooling system configuration employing multiple composite elastocaloric devices of the second embodiment.

Although FIG. 15A employs gravity to position the composite devices 402 within their respective support paths 1510, other mechanisms (whether passive or active) for positioning the composite devices 402 are also possible according to one or more embodiments. For example, FIG. 15B illustrates a configuration 1550 that employs a separate guide path 1554 positioned adjacent to the rotating support disk 1502 (e.g., above the rotating support disk) and that interacts with guide pins 1552 on the respective composite devices 402 to properly position the devices 402 within its respective path 1510 as the support disk 1502 rotates. Operation of the configuration 1550 of FIG. 15B is otherwise the same as that of FIG. 15A. Moreover, this configuration 1550 allows the support disk 1502 to be oriented without relying on gravity, for example, where the plane of rotation is substantially horizontal. Other positioning mechanisms, such as a cam setup, are also possible according to one or more contemplated embodiments.

Figure 16A:
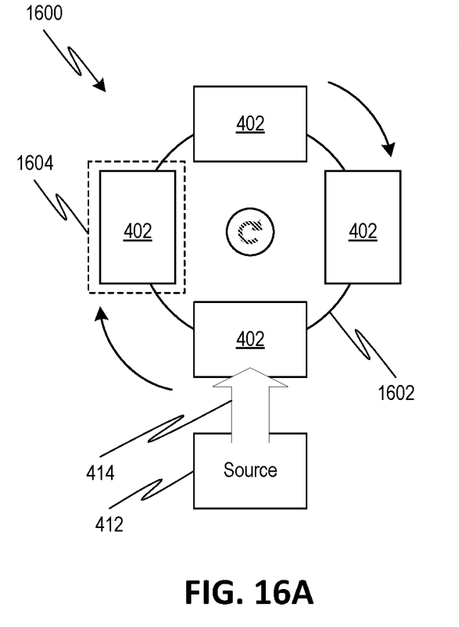
FIG. 16A is a simplified schematic diagram of a sixth exemplary cooling system configuration employing multiple composite elastocaloric devices of the second embodiment.

FIG. 16A illustrates another exemplary configuration 1600 where a rotary actuator 1602 positions composite devices 402 with respect to a magnetic field 414 from a magnetic source 412. In contrast to the configuration of FIGS. 15A-15B, the configuration of FIG. 16A employs a magnetic source 412 that only applies the field to an adjacent device 402 at one location (e.g., at the 6 o'clock position). The magnetic field 414 applied to the composite device 402 by source 412 causes the magnetostrictive material therein to increase in size, thereby stressing the elastocaloric material therein in preparation for cooling. As the rotary actuator 1602 moves in a clockwise direction, the device 402 moves out of the applied magnetic field 414. The magnetostrictive material within the composite device 402 thus reverts to its previous size, thereby releasing stress on the elastocaloric material therein and providing a cooling effect to cooling zone 1604.

In some embodiments, the configuration 1600 of FIG. 16A can be further modified, for example, by including a second magnetic source at the 12 o'clock position and providing a second cooling zone at the 3 o'clock position. Alternatively or additionally, the rotary actuator can provide oscillatory motion rather than circular clockwise motion. For example, a pair of composite devices 402 can oscillate back and forth between the 12 o'clock and 6 o'clock positions via the 9 o'clock position. In such a configuration, magnetic sources 412 at the 6 and 12 o'clock positions can load one of the pair of composite devices 402 while the other of the pair of composite devices 402 provides cooling to zone 1604.

Figure 16B:
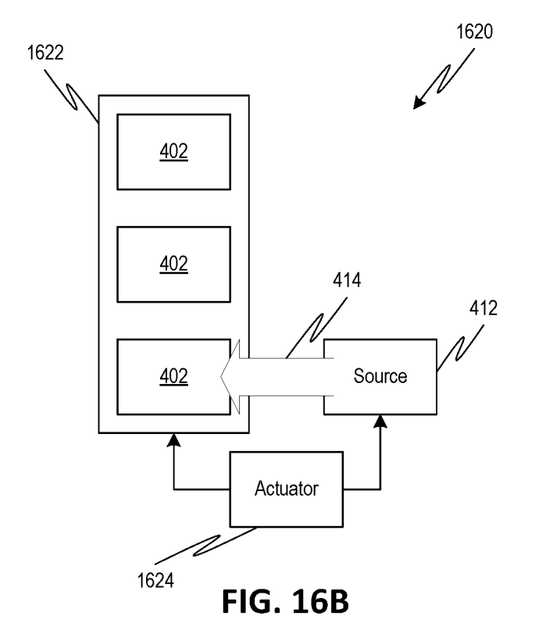
FIG. 16B is a simplified schematic diagram of a seventh exemplary cooling system configuration employing multiple composite elastocaloric devices of the second embodiment.

FIG. 16B illustrates still another exemplary configuration 1620 where an actuator 1624 is used to position an array of composite devices 402 and/or a magnet source 412 with respect to each other. For example, the actuator 1624 can move the array 1622 such that one (or more) of the composite devices 402 is aligned with an applied magnetic field 414 from source 412. Alternatively or additionally, the actuator 1624 can move the source 412 relative to the array 1622 to align one (or more) of the composite device 402 with the applied magnetic field 414.

In some embodiments, the configuration 1620 of FIG. 16B can be further modified, for example, by including a second magnetic source to simultaneously apply a magnetic field to another composite device 402 of the array 1622 (e.g., the uppermost device 402 in FIG. 16B). Cooling can thus be provided at a location of the middle device 402 of the array 1622. Alternatively or additionally, the actuator 1624 can provide a reciprocating motion to the array 1622. For example, the array 1622 having a pair of composite devices 402 can reciprocate between top and bottom positions via the middle position of array 1622. In such a configuration, magnetic sources 412 at the top and bottom positions can load one of the pair of composite devices 402 while the other of the pair of composite devices 402 provides cooling to the middle position.

One of ordinary skill in the art will readily appreciate that the above description is not exhaustive, and that aspects of the disclosed subject matter may be implemented other than as specifically disclosed above. Although exemplary arrangements of components have been discussed above, one of ordinary skill in the art will understand that the teachings of the present disclosure can be extended to other arrangements. Thus, embodiments of the disclosed subject matter are not limited to the specific arrangements discussed herein.

It will be appreciated that some aspects of the disclosed subject matter can be implemented, fully or partially, in hardware, hardware programmed by software, software instruction stored on a computer readable medium (e.g., a non-transitory computer readable medium), or any combination of the above. For example, components of the disclosed subject matter, including components such as a controller, method, process, or any other feature, can include, but are not limited to, a personal computer or workstation or other such computing system that includes a processor, microprocessor, microcontroller device, or is comprised of control logic including integrated circuits such as, for example, an application specific integrated circuit (ASIC).

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

It is thus apparent that there is provided, in accordance with the present disclosure, systems and methods for cooling using a composite elastocaloric device. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicant intends to embrace all such alternatives, modifications, equivalents, and variations that are within the spirit and scope of the present invention.

The invention claimed is:

1. A method for cooling comprising:
    (a) applying an electric or magnetic field to a first member, such that a first material of the first member increases in size in response to the applied field and stresses an elastocaloric material of a second member mechanically coupled to the first member; and
    (b) after (a), removing the electric or magnetic field from the first member, such that the first material returns to its size prior to (a), thereby releasing stress on the elastocaloric material from the first material,
    wherein the releasing stress of (b) causes the elastocaloric material to absorb heat.

2. The method of claim 1, wherein the stressing the elastocaloric material of (a) causes the elastocaloric material of the second member to release heat.

3. The method of claim 1, wherein the applying of (a) comprises increasing the electric or magnetic field over time such that a temperature of the elastocaloric material of the second member during the stressing remains substantially constant.

4. The method of claim 1, comprising:
(c) during (b), applying another electric or magnetic field to a third member, such that another first material of the third member increases in size in response to the applied field and stresses another elastocaloric material of a fourth member mechanically coupled to the third member; and
(d) after (c), removing the another electric or magnetic field from the third member, such that the another first material returns to its size prior to (c), thereby releasing stress on the another elastocaloric material from the third member,
wherein the releasing stress of (d) causes the another elastocaloric material to absorb heat, and
the elastocaloric material of the second member and the another elastocaloric material of the fourth member provide sequential cooling.

5. The method of claim 1, wherein the elastocaloric material comprises a copper-based shape memory alloy (SMA).

6. The method of claim 5, wherein the copper-based SMA is selected from the group consisting of copper aluminum manganese, copper aluminum nickel, and copper zinc aluminum.

7. The method of claim 1, wherein at least one of the first member and the second member comprises a second material that thermally insulates the elastocaloric material of the second member.

8. The method of claim 7, wherein the second material comprises an yttria-tetragonal zirconia polycrystal ceramic.

9. The method of claim 1, wherein the first material comprises a magnetostrictive material.

10. The method of claim 9, wherein the magnetostrictive material is selected from the group consisting of terbium dysprosium iron alloy (Terfenol-D), iron gallium alloy (Galfenol), iron aluminum alloy (Alfenol), iron silicon boron carbon alloy, and cobalt ferrite.

11. The method of claim 9, wherein an orientation of the magnetic field during (a) is substantially aligned with a longitudinal direction of the magnetostrictive material along which the magnetostrictive material increases in size.

12. The method of claim 9, wherein a magnitude of the magnetic field applied in (a) is less than or equal to 0.3 T, and the heat absorbed in (b) causes a change in temperature of at least 3K.

13. The method of claim 1, wherein the first material comprises a piezoelectric material.

14. The method of claim 13, wherein the piezoelectric material is a single crystal or polycrystal of lead magnesium niobate-lead titanate, lead zinc niobate-lead titanate, or lead indium niobate-lead magnesium niobate-lead titanate.

15. The method of claim 1, further comprising, prior to (a), installing the first and second members in a support frame such that the first member is mechanically coupled to the second member, wherein the second member is installed in a pre-stressed state.

16. The method of claim 15, wherein a surface of the first member is in direct contact with a surface of the second member.

17. The method of claim 15, wherein a force-applying surface of the first member is coupled to a surface of the second member via one or more intervening members.

18. A system comprising:
at least one composite cooling device, each composite cooling device comprising:
a first member having a first material; and
a second member having an elastocaloric material;
wherein the first material is configured to increase in size in response to an applied electric or magnetic field and to return to its prior size upon removal of the applied electric or magnetic field, and
the first and second members are mechanically coupled together such that the increase in size of the first material applies a stress to the elastocaloric material and the return of the first material to its prior size releases said stress thereby causing the elastocaloric material to absorb heat.

19. The system of claim 18, further comprising a source constructed to apply the electric or magnetic field to the first material.

20. The system of claim 19, wherein the source comprises one or more magnets.

21. The system of claim 19, wherein the source comprises one or more voltage sources.

22. The system of claim 19, further comprising a controller that controls a position of the first member or operation of the source so as to control application of the electric or magnetic field to the first material.

23. The system of claim 18, wherein a plurality of composite cooling devices is provided, and further comprising an actuator that moves the plurality of composite cooling devices with respect to a magnetic field.

24. The system of claim 18, further comprising a support frame in which the first and second members are installed.

25. The system of claim 24, wherein the second member is installed in the support frame in a pre-stressed state prior to application of any electric or magnetic field.

26. The system of claim 18, wherein a surface of the first member is in direct contact with a surface of the second member.

27. The system of claim 18, wherein a force-applying surface of the first member is coupled to a surface of the second member via one or more intervening members.

28. The system of claim 18, further comprising:
a third member comprising another first material; and
a fourth member comprising another elastocaloric material,
wherein the third and fourth members are mechanically coupled together such that the increase in size of the another first material applies a stress to the another elastocaloric material and the return of the another first material to its prior size releases said stress thereby causing the another elastocaloric material to absorb heat, and
wherein the third and fourth members are configured to provide heat absorption subsequent to that of the first and second members.

29. The system of claim 18, wherein the elastocaloric material comprises a copper-based shape memory alloy (SMA).

30. The system of claim 29, wherein the copper-based SMA is selected from the group consisting of copper aluminum manganese, copper aluminum nickel, and copper zinc aluminum.

31. The system of claim 18, wherein at least one of the first member and the second member comprises a second material that thermally insulates the elastocaloric material of the second member.

32. The system of claim 31, wherein the second material comprise an yttria-tetragonal zirconia polycrystal ceramic.

33. The system of claim 18, wherein the first material comprises a magnetostrictive material.

34. The system of claim 33, wherein the magnetostrictive material is selected from the group consisting of terbium dysprosium iron alloy (Terfenol-D), iron gallium alloy (Galfenol), iron aluminum alloy (Alfenol), iron silicon boron carbon alloy, and cobalt ferrite.

35. The system of claim 18, wherein the first material comprises a piezoelectric material.

36. The system of claim 35, wherein the piezoelectric material is a single crystal or polycrystal of lead magnesium niobate-lead titanate, lead zinc niobate-lead titanate, or lead indium niobate-lead magnesium niobate-lead titanate.

* * * * *